(12) United States Patent
Carroll

(10) Patent No.: US 9,105,848 B2
(45) Date of Patent: Aug. 11, 2015

US009105848B2

(54) COMPOSITE ORGANIC MATERIALS AND APPLICATIONS THEREOF

(75) Inventor: David L. Carroll, Winston-Salem, NC (US)

(73) Assignee: WAKE FOREST UNIVERSITY, Winston-Salem, NC (US)

( * ) Notice: Subject to any disclaimer, the term of this patent is extended or adjusted under 35 U.S.C. 154(b) by 1614 days.

(21) Appl. No.: 12/376,598

(22) PCT Filed: Aug. 7, 2007

(86) PCT No.: PCT/US2007/017544
§ 371 (c)(1),
(2), (4) Date: Nov. 4, 2010

(87) PCT Pub. No.: WO2008/097272
PCT Pub. Date: Aug. 14, 2008

(65) Prior Publication Data
US 2011/0041895 A1 Feb. 24, 2011

Related U.S. Application Data

(60) Provisional application No. 60/835,948, filed on Aug. 7, 2006, provisional application No. 60/925,213, filed on Apr. 19, 2007.

(51) Int. Cl.
*H01L 31/00* (2006.01)
*H01L 51/00* (2006.01)
*B82Y 10/00* (2011.01)
*H01L 51/42* (2006.01)

(52) U.S. Cl.
CPC .............. *H01L 51/0007* (2013.01); *B82Y 10/00* (2013.01); *H01L 51/4273* (2013.01); *H01L 51/0003* (2013.01); *H01L 51/0026* (2013.01); *H01L 51/0036* (2013.01); *H01L 51/0037* (2013.01); *H01L 51/0047* (2013.01); *H01L 51/4246* (2013.01); *H01L 51/4253* (2013.01); *Y02E 10/549* (2013.01)

(58) Field of Classification Search
USPC ........................................................ 136/263
See application file for complete search history.

(56) References Cited

U.S. PATENT DOCUMENTS

| | | | |
|---|---|---|---|
| 4,130,343 A | 12/1978 | Miller et al. | |
| 4,913,744 A | 4/1990 | Hoegl et al. | |
| 6,093,757 A | 7/2000 | Pern | |
| 6,340,789 B1 | 1/2002 | Petritsch et al. | |
| 6,399,873 B1 | 6/2002 | Sano et al. | |
| 6,420,031 B1 | 7/2002 | Parthasarathy et al. | |
| 6,538,375 B1 | 3/2003 | Duggal et al. | |
| 6,576,341 B1 | 6/2003 | Davey et al. | |
| 6,580,027 B2 | 6/2003 | Forrest et al. | |
| 6,657,378 B2 | 12/2003 | Forrest et al. | |
| 6,667,360 B1 | 12/2003 | Ng et al. | |
| 6,685,986 B2 | 2/2004 | Oldenburg et al. | |
| 6,946,597 B2 | 9/2005 | Sager et al. | |
| 7,026,079 B2 | 4/2006 | Louwet et al. | |
| 7,194,173 B2 | 3/2007 | Shtein et al. | |
| 7,358,291 B2 | 4/2008 | Curran et al. | |
| 2002/0161101 A1* | 10/2002 | Carroll et al. ................. | 524/495 |
| 2002/0189666 A1 | 12/2002 | Forrest et al. | |
| 2003/0006401 A1 | 1/2003 | Haghighat et al. | |
| 2003/0035979 A1 | 2/2003 | Chen et al. | |
| 2003/0096113 A1 | 5/2003 | Jacobson et al. | |
| 2003/0099858 A1 | 5/2003 | Duggal et al. | |
| 2003/0136943 A1 | 7/2003 | Alivisatos et al. | |
| 2003/0168756 A1 | 9/2003 | Balkus, Jr. et al. | |
| 2003/0178607 A1 | 9/2003 | Swager et al. | |
| 2004/0102577 A1 | 5/2004 | Hsu et al. | |
| 2004/0124504 A1 | 7/2004 | Hsu | |
| 2004/0127637 A1 | 7/2004 | Hsu et al. | |
| 2004/0187911 A1 | 9/2004 | Gaudiana et al. | |
| 2004/0187917 A1 | 9/2004 | Pichler | |
| 2004/0202436 A1 | 10/2004 | Cho et al. | |
| 2004/0241900 A1 | 12/2004 | Tsukamoto et al. | |
| 2004/0256001 A1 | 12/2004 | Mitra et al. | |
| 2005/0009224 A1 | 1/2005 | Yang et al. | |
| 2005/0042556 A1 | 2/2005 | Louwet et al. | |
| 2005/0056815 A1 | 3/2005 | Miteva et al. | |
| 2005/0061363 A1 | 3/2005 | Ginley et al. | |
| 2005/0074706 A1 | 4/2005 | Bristol et al. | |

(Continued)

FOREIGN PATENT DOCUMENTS

DE 69908016 8/2004
EP 1105772 B1 4/1999

(Continued)

OTHER PUBLICATIONS

Phenomenex, "Solvent Miscibility Table", 2008, p. 1.*
Li et al., "A fullerene-single wall carbon nanotube complex for polymer bulk heterojucntion photovoltaic cells", Journal of Materials Chemistry, Mar. 12, 2007, pp. 2406-2411.*
Sigma-Aldrich, "Poly(3-hexylthiophene-2,5-diyl)," 2014.*
Ruoff et al., "Solubility of C60 in a variety of solvents", J. Phys. Chem. 97, 1993, pp. 3379-3383.*
International Search Report and Written Opinion of the International Searching Authority, PCT/US2007/017544, international filing date Jul. 8, 2007, 14 pages.
Supplementary European Search Report, dated Sep. 15, 2009, Application No. EP 07 76 1674, 2 pages.
International Search Report and Written Opinion of the International Searching Authority, PCT/US07/67925, international filing date May 1, 2007, 5 pages.
International Search Report and Written Opinion of the International Searching Authority PCT/US2006/016730, international filing date May 1, 2006, 7 pages.

(Continued)

*Primary Examiner* — Thanh-Truc Trinh
(74) *Attorney, Agent, or Firm* — J. Clinton Wimbish; Smith Moore Leatherwood LLP

(57) ABSTRACT

The present invention provides composite organics and optoelectronic devices, including photovoltaic devices, comprising the same. In one embodiment, the present invention provides a photovoltaic cell comprising a radiation transmissive first electrode, a photosensitive layer electrically connected to the first electrode, the photosensitive layer comprising a plurality of composite organic layers, wherein each of the plurality of composite organic layers comprises a polymeric phase and a nanoparticle phase, the nanoparticle phase comprising at least one exaggerated nanocrystalline grain.

21 Claims, 7 Drawing Sheets

(56) References Cited

U.S. PATENT DOCUMENTS

| | | |
|---|---|---|
| 2005/0110145 A1 | 5/2005 | Elers |
| 2005/0159581 A1 | 7/2005 | Vanderzande et al. |
| 2005/0189014 A1 | 9/2005 | Gaudiana et al. |
| 2005/0209388 A1 | 9/2005 | Hsu et al. |
| 2005/0211293 A1 | 9/2005 | Enomoto et al. |
| 2005/0211294 A1 | 9/2005 | Chittibabu et al. |
| 2005/0224788 A1 | 10/2005 | Hsu et al. |
| 2005/0236035 A1 | 10/2005 | Yang et al. |
| 2005/0257827 A1 | 11/2005 | Gaudiana et al. |
| 2005/0263178 A1 | 12/2005 | Montello et al. |
| 2005/0263179 A1 | 12/2005 | Gaudiana et al. |
| 2005/0263180 A1 | 12/2005 | Montello et al. |
| 2005/0268962 A1 | 12/2005 | Gaudiana et al. |
| 2005/0274408 A1 | 12/2005 | Li et al. |
| 2006/0005876 A1 | 1/2006 | Gaudiana et al. |
| 2006/0013549 A1 | 1/2006 | Shtein et al. |
| 2006/0021647 A1 | 2/2006 | Gui et al. |
| 2006/0027834 A1 | 2/2006 | Forrest et al. |
| 2006/0076048 A1 | 4/2006 | Gaudiana et al. |
| 2006/0076050 A1* | 4/2006 | Williams et al. ............... 136/263 |
| 2006/0079626 A1 | 4/2006 | Curran et al. |
| 2006/0090791 A1 | 5/2006 | Gaudiana et al. |
| 2006/0096633 A1 | 5/2006 | Chu |
| 2006/0107997 A1 | 5/2006 | Matsui et al. |
| 2006/0118768 A1 | 6/2006 | Liu et al. |
| 2006/0159611 A1 | 7/2006 | Hummelen et al. |
| 2006/0185714 A1 | 8/2006 | Nam et al. |
| 2006/0201390 A1 | 9/2006 | Lahann et al. |
| 2006/0211272 A1 | 9/2006 | Lee et al. |
| 2006/0216610 A1 | 9/2006 | Galvin et al. |
| 2006/0225778 A1 | 10/2006 | Brabec et al. |
| 2006/0225782 A1 | 10/2006 | Berke et al. |
| 2006/0243959 A1 | 11/2006 | Sargent et al. |
| 2006/0249203 A1 | 11/2006 | Li et al. |
| 2006/0252853 A1 | 11/2006 | Ajayan et al. |
| 2006/0257657 A1 | 11/2006 | Curran et al. |
| 2006/0261733 A1 | 11/2006 | Suzuki et al. |
| 2006/0266982 A1 | 11/2006 | Su et al. |
| 2006/0272701 A1 | 12/2006 | Ajayan et al. |
| 2006/0293426 A1 | 12/2006 | Curran et al. |
| 2007/0012349 A1 | 1/2007 | Gaudiana et al. |
| 2007/0014939 A1 | 1/2007 | Gaudiana et al. |
| 2007/0037302 A1 | 2/2007 | Gaudiana et al. |
| 2007/0051941 A1 | 3/2007 | Duerr et al. |
| 2007/0082140 A1 | 4/2007 | Suzuki et al. |
| 2007/0089779 A1 | 4/2007 | Balasubramanian et al. |
| 2007/0089784 A1* | 4/2007 | Noh et al. ............... 136/263 |
| 2007/0096085 A1 | 5/2007 | Rand et al. |
| 2007/0102694 A1 | 5/2007 | Drndic et al. |
| 2007/0108539 A1 | 5/2007 | Brabec et al. |
| 2007/0112133 A1 | 5/2007 | Lee et al. |
| 2007/0115399 A1 | 5/2007 | Brabec et al. |
| 2007/0137701 A1* | 6/2007 | Sainte Catherine et al. .. 136/263 |
| 2007/0138483 A1 | 6/2007 | Lee et al. |
| 2007/0176174 A1 | 8/2007 | Lee et al. |
| 2007/0224464 A1 | 9/2007 | Balasubramanian et al. |
| 2007/0275498 A1 | 11/2007 | Beecher et al. |
| 2007/0278481 A1 | 12/2007 | Lee et al. |
| 2007/0289626 A1 | 12/2007 | Brabee et al. |
| 2007/0290197 A1 | 12/2007 | Firon et al. |
| 2008/0006322 A1 | 1/2008 | Wang et al. |
| 2008/0020208 A1 | 1/2008 | Lee et al. |
| 2008/0041447 A1 | 2/2008 | Tseng et al. |
| 2008/0066802 A1 | 3/2008 | Reddy |
| 2008/0110494 A1 | 5/2008 | Reddy |
| 2008/0230120 A1 | 9/2008 | Reddy |
| 2008/0308148 A1 | 12/2008 | Leidholm et al. |
| 2009/0050207 A1 | 2/2009 | Galvin et al. |
| 2009/0084436 A1 | 4/2009 | Yang et al. |
| 2009/0120491 A1 | 5/2009 | Berson et al. |
| 2009/0126796 A1 | 5/2009 | Yang et al. |
| 2009/0173372 A1 | 7/2009 | Carroll et al. |
| 2009/0232867 A1 | 9/2009 | Domb et al. |
| 2009/0242416 A1 | 10/2009 | Yun et al. |
| 2009/0301565 A1 | 12/2009 | Curran et al. |

FOREIGN PATENT DOCUMENTS

| | | | |
|---|---|---|---|
| EP | 1180805 A2 | 2/2002 | |
| EP | 1470597 B1 | 1/2003 | |
| EP | 0949199 B1 | 5/2003 | |
| EP | 1672653 A2 | 12/2005 | |
| GB | 2430679 A | 9/2005 | |
| WO | 0155697 A1 | 2/2001 | |
| WO | 03065471 A2 | 8/2003 | |
| WO | 2004046031 A1 | 3/2004 | |
| WO | 2004053464 A1 | 6/2004 | |
| WO | 2004053546 A1 | 6/2004 | |
| WO | 2005050757 A3 | 6/2005 | |
| WO | 2005124891 A1 | 12/2005 | |
| WO | 2006083308 A3 | 8/2006 | |
| WO | 2006098783 A3 | 9/2006 | |
| WO | WO 2006/137940 * | 12/2006 | ................ F21V 9/16 |
| WO | 2007022221 A2 | 2/2007 | |
| WO | 2007029275 A1 | 3/2007 | |
| WO | 2007076843 A1 | 7/2007 | |
| WO | 2007100600 A3 | 9/2007 | |
| WO | 2007130972 A2 | 11/2007 | |
| WO | 2008012079 A1 | 1/2008 | |
| WO | 2009012465 A9 | 1/2009 | |

OTHER PUBLICATIONS

Peumans et al., Efficient Bulk Heterojunction Photovoltaic Cells Using Small-Molecular-Weight Organic Think Films, Letters to Nature, vol. 425, Sep. 11, 2001, pp. 158-162.

Strumpel et al., Erbium-Doped Up-Converters on Silicon Solar Cells: Assessment of the Potential, 4 pages, 2005.

Shaheen et al., 2.5% Efficient Organic Plastic Solar Cells, Applied Physics Letters, vol. 78, No. 6, Feb. 5, 2001, pp. 841-843.

Reyes-Reyes et al., Meso-Structure Formation for Enhanced Organic Photovoltaic Cells, Organic Letters, 2005, vol. 7, No. 26, pp. 5749-5752.

Chen et al., Upconversion Luminescence of Eu3+ and Mn2+ in ZnS:Mn2+, Eu3+ Codoped Nanoparticles, Journal of Applied Physics, vol. 95, No. 2, Jan. 15, 2004, pp. 667-672.

Torres et al., Concentration Enhanced Red Upconversion in Nanocrystalline ZrO2: Er under IR Excitation, Journal of Physics D: Applied Physics, Sep. 1, 2004, 2 pages.

Cadek et al., Morphological and Mechanical Properties of Carbon-Nanotube-Reinforced Semicrystalline and Amorphous Polymer composites, Applied Physics Letters, vol. 81, No. 27, Dec. 30, 2002, pp. 5123-5125.

Cadek et al., Reinforcement of Polymers with Carbon Nanotubes: The Role of Nanotube Surface Area, Nano Letters, 2004, vol. 4, No. 2, pp. 353-356.

Biercuk et al., Carbon Nanotube Composites for Thermal Management, Applied Physics Letters, vol. 80, No. 15, Apr. 15, 2002, pp. 2767-2769.

Blake et al., A Generic Organometallic Approach Toward Ultra-Strong Carbon Nanotube Polymer Composites, J. Am. Chem. Soc. 2004, vol. 126, No. 33, pp. 10226-10227.

Peumans et al., Very-high-efficiency Double-heterostructure Copper Phthalocyanine/C60 Photovoltaic Cells, Applied Physics Letters, vol. 79, No. 1, Jul. 2, 2001, pp. 126-128.

Yakomov et al., High Photovoltage Multiple-heterojunction Organic Solar Cells Incorpoarting Interfacial Metallic Nanoclusters, Applied Physics Letters, vol. 80, No. 9, Mar. 4, 2002, pp. 1667-1669.

Rao et al., Nanotubes, Chemphyschem 2001, 2, pp. 78-105.

Postma et al., Carbon Nanotube Single-Electron Transistors at Room Temperature, Science, vol. 293, Jul. 6, 2001, pp. 76-79.

Ajayan, Nanotubes from Carbon, Chem Rev 99, (1990) pp. 1787-1799.

Bernhole et al., Mechanical and Electrical Properties of Nanotubes, Annu Rev Mater Res 32 (2002), pp. 347-375.

Dai et al., Controlled Synthesis and Modification of Carbon Nanotubes and C60: Carbon Nanostructures for Advanced Polymeric Composite Materials, Adv. Mater, 13, (2001) pp. 899-913.

Qian et al., Load Transfer and Deformation Mechanisms in Carbon Nanotube-Polystyrene Composites, Appl Phys Lett vol. 76, May 2000, pp. 2868-2870.

(56) References Cited

OTHER PUBLICATIONS

Tans et al., Room-temperature transistor based on a single carbon nanotube, Letters to Nature, vol. 393, pp. 49-52, 1998.
Dresselhaus et al., Carbon Nanotubes: Synthesis, Structure, Properties, and Applications, Springer-Verlag, Berlin, 2001, 8 pages.
Huynh et al., Adv Mater 1999, 11, No. 11, pp. 923-928.
Hoppe et al., Adv Funct Mater 2004, 14, No. 10, October.
Tsuzuki et al., Solar Energy Materials and Solar Cells, vol. 61, Issue 1, Feb. 15, 2000, pp. 1-8.
Kang et al., 3rd World Conference on Photovoltaic Energy Conversion, May 11-18, 2003, Osaka, Japan.
Frogley et al., Composites Science and Technology, vol. 63, Issue 11, Aug. 2003, pp. 1647-1654.
Tammela et al., Optical Fiber Communication Conference, vol. 2, Feb. 23-27, 2004.
Coakley et al., Conjugated Polymer Photovoltaic Cells, Chem Mater, 2004, 16, 4533-4542.
Ferrere et al., New perylenes for dye sensitization of TiO2, New J Chem, 2002, 26, 1155-1160.
Wang et al., Luminescence Spectroscopy and Visible Upconversion Properties of ER3+ in ZnO Nanocrystals, J Phys Chem B, 2004, 108, 18408-18413.
Zhokhavets et al., Effect of annealing of poly(3-hexylthiophene)/fullerene bulk heterojunction composites on structural and optical properties, Thin Solid Films, vol. 496, No. 2, pp. 679-682, Oct. 12, 2005, Elsevier-Sequoia S. A.
Drechsel et al., Efficient organic solar cells based on a double p-i-n architecture using doped wide-gap transport layers, Applied Physics Letters, vol. 86, No. 24, Jun. 7, 2005, pp. 244102-1 through 244102-3, AIP, American Institute of Physics, Melville, NY.
Kim et al., Thermal diffusion processes in bulk heterojunction formation for poly-3-hexylthiophene/C60 single heterojunction photovoltaics, Applied Physics Letters, vol. 88, No. 18, May 4, 2006, pp. 181911-1 through 181911-3, AIP, American Institute of Physics, Melville, NY.
Chirvase et al., Influence of nanomorphology on the photovoltaic action of polymer-fullerene composites, Nanotechnology 15, 2004, pp. 1317-1323.
International Search Report and Written Opinion of the International Searching Authority, PCT/US2008/082262, international filing date Mar. 11, 2008, 9 pages.
Curran et al., The cascade solar cell, SPIE Newsroom, 2 pages, 2006.
George Odian, "Principles of Polymerization", Third Edition, A Wiley-Interscience Publication, 1991, p. 302.
Daniel C. Harris, "Quantitative Chemical Analysis", Fourth Edition, W. H. Freeman and Company, 1982, p. 830.
D. A. Porter et al., "Phase Transformations in Metals and Alloys", Second Edition, Taylor & Francis Group, 1981, p. 263-264.

\* cited by examiner

US 9,105,848 B2

COMPOSITE ORGANIC MATERIALS AND APPLICATIONS THEREOF

RELATED APPLICATION DATA

The present application hereby claims priority under 35 U.S.C. §119(e) to U.S. Provisional Patent Application Ser. No. 60/835,948 filed Aug. 7, 2006 and U.S. Provisional Patent Application No. 60/925,213 filed Apr. 19, 2007.

STATEMENT OF GOVERNMENT LICENSE RIGHTS

This invention was made through the support of the Department of Defense (United States Air Force Office of Scientific Research (AFOSR) Grant No. FA9550-04-1-0161). The Federal Government may retain certain license rights in this invention.

FIELD OF THE INVENTION

The present invention relates to organic thin films and, in particular, to composite organic thin films.

BACKGROUND OF THE INVENTION

Organic thin films have been heavily investigated in recent years due to their applications in optoelectronic devices such as organic light emitting devices (OLEDs), photovoltaic devices, and organic photodetectors.

Optoelectronic devices based on organic materials, including organic thin films, are becoming increasingly desirable in a wide variety of applications for a number of reasons. Materials used to construct organic optoelectronic devices are relatively inexpensive in comparison to their inorganic counterparts thereby providing cost advantages over optoelectronic devices produced with inorganic materials. Moreover, organic materials provide desirable physical properties, such as flexibility, permitting their use in applications unsuitable for rigid materials.

Photovoltaic devices convert electromagnetic radiation into electricity by producing a photo-generated current when connected across a load and exposed to light. The electrical power generated by photovoltaic cells can be used in many applications including lighting, heating, battery charging, and powering devices requiring electrical energy.

When irradiated under an infinite load, a photovoltaic device produces its maximum possible voltage, the open circuit voltage or $V_{oc}$. When irradiated with its electrical contacts shorted, a photovoltaic device produces its maximum current, I short circuit or $I_{sc}$. Under operating conditions, a photovoltaic device is connected to a finite load, and the electrical power output is equal to the product of the current and voltage. The maximum power generated by a photovoltaic device cannot exceed the product of $V_{oc}$ and $I_{sc}$. When the load value is optimized for maximum power generation, the current and voltage have the values $I_{max}$ and $V_{max}$ respectively.

A key characteristic in evaluating a photovoltaic cell's performance is the fill factor, ff. The fill factor is the ratio of the photovoltaic cell's actual power to its power if both current and voltage were at their maxima. The fill factor of a photovoltaic cell is provided according to equation (1).

$$ff=(I_{max}V_{max})/(I_{sc}V_{oc}) \qquad (1)$$

The fill factor of a photovoltaic is always less than 1, as $I_{sc}$ and $V_{oc}$ are never obtained simultaneously under operating conditions. Nevertheless, as the fill factor approaches a value of 1, a device demonstrates less internal resistance and, therefore, delivers a greater percentage of electrical power to the load under optimal conditions.

Photovoltaic devices may additionally be characterized by their efficiency of converting electromagnetic energy into electrical energy. The conversion efficiency, $\eta_p$, of a photovoltaic device is provided according to equation (2) where $P_{inc}$ is the power of the light incident on the photovoltaic.

$$\eta_p=f\!f^*(I_{sc}V_{oc})/P_{inc} \qquad (2)$$

Devices utilizing crystalline or amorphous silicon dominate commercial applications, and some have achieved efficiencies of 23% or greater. However, efficient crystalline-based devices, especially ones of large surface area, are difficult and expensive to produce due to the problems in fabricating large crystals free from crystalline defects that promote exciton recombination. Commercially available amorphous silicon photovoltaic cells demonstrate efficiencies ranging from about 4 to 12%.

Constructing organic photovoltaic devices having efficiencies comparable to inorganic devices poses a technical challenge. Some organic photovoltaic devices demonstrate efficiencies on the order of 1% or less. The low efficiencies displayed in organic photovoltaic devices results from a severe length scale mismatch between exciton diffusion length ($L_D$) and organic layer thickness. In order to have efficient absorption of visible electromagnetic radiation, an organic film must have a thickness of about 500 nm. This thickness greatly exceeds exciton diffusion length which is typically about 50 nm, often resulting in exciton recombination.

It would be desirable to provide organic thin films that permit efficient absorption of electromagnetic radiation while reducing exciton recombination. In view of the advantages of organic optoelectronic devices discussed herein, it would also be desirable to provide photovoltaic devices comprising organic thin films operable to demonstrate conversion efficiencies comparable to, and, in some cases, greater than inorganic photovoltaic devices.

SUMMARY

The present invention provides composite organic materials and optoelectronic devices, including photovoltaic devices, comprising the same.

In one embodiment, the present invention provides a composite organic layer comprising a polymeric phase and a nanoparticle phase, the nanoparticle phase comprising at least one exaggerated nanocrystalline grain. An exaggerated nanocrystalline grain, as used herein, refers to a crystalline nanoparticle formed from a plurality of nanoparticles, such as carbon nanoparticles, during exaggerated or abnormal grain growth. In some embodiments, nanoparticle phases of composite organic layers comprise a plurality of exaggerated nanocrystalline grains. In one embodiment, a composite organic layer comprises an organic thin film.

In another embodiment, the present invention provides photovoltaic cells. In some embodiments, a photovoltaic cell comprises a radiation transmissive first electrode, a photosensitive layer electrically connected to the first electrode, the photosensitive layer comprising a plurality of composite organic layers, wherein each of the plurality of composite organic layers comprises a polymeric phase and a nanoparticle phase, the nanoparticle phase comprising at least one exaggerated nanocrystalline grain. A second electrode is electrically connected to the photosensitive layer.

In other embodiments, a photovoltaic cell comprises a radiation transmissive first electrode, a photosensitive layer electrically connected to the first electrode, the photosensitive layer comprising a first composite organic layer and a second composite organic layer, wherein the first and second composite organic layers each comprise a polymeric phase and a nanoparticle phase, the nanoparticle phase comprising at least one exaggerated nanocrystalline grain. A second electrode is electrically connected to the photosensitive layer.

In a further embodiment, a photovoltaic cell comprises a radiation transmissive first electrode, a photosensitive layer electrically connected to the first electrode, the photosensitive layer comprising at least one composite organic layer, and a second electrode electrically connected to the photosensitive layer, wherein the at least one composite organic layer comprises a polymeric phase and a nanoparticle phase, the nanoparticle phase comprising at least one exaggerated nanocrystalline grain. In some embodiments, a boosting layer is disposed between the photosensitive layer and first or second electrode. In embodiments wherein the photosensitive layer comprises a plurality of composite organic layers, a boosting layer can be disposed between composite organic layers of the photosensitive layer.

In some embodiments, a boosting layer comprises pyroelectric materials, piezoelectric materials, electret materials, conjugated polymeric materials or combinations thereof. The boosting layer, according to some embodiments of the present invention, can add the offset voltage of the pyroelectric, piezoelectric, and/or electret material thereby creating a higher $V_{oc}$ and allowing for the use of smaller bandgap materials in the photosensitive layer. In one embodiment, a boosting layer comprises polymeric piezoelectric and/or pyroelectric materials.

In another aspect, the present invention provides a photoactive apparatus. In one embodiment, a photoactive apparatus comprises at least one pixel comprising a photovoltaic cell, the photovoltaic cell comprising a radiation transmissive first electrode, a photosensitive layer electrically connected to the first electrode, the photosensitive layer comprising a plurality of composite organic layers, wherein each of the plurality of composite organic layers comprises a polymeric phase and a nanoparticle phase, the nanoparticle phase comprising at least one exaggerated nanocrystalline grain. A second electrode is electrically connected to the photosensitive layer. In some embodiments, a photoactive apparatus comprises a plurality of pixels.

In another embodiment, a photoactive apparatus comprises at least one pixel comprising a photovoltaic cell, the photovoltaic cell comprising a radiation transmissive first electrode, a photosensitive layer electrically connected to the first electrode, the photosensitive layer comprising a first composite organic layer and a second composite organic layer, wherein the first and second composite organic layers each comprise a polymeric phase and a nanoparticle phase, the nanoparticle phase comprising at least one exaggerated nanocrystalline grain. A second electrode is electrically connected to the photosensitive layer.

In a further embodiment, a photoactive apparatus comprises at least one pixel comprising a photovoltaic cell, the photovoltaic cell comprising a radiation transmissive first electrode, a photosensitive layer electrically connected to the first electrode, the photosensitive layer comprising at least one composite organic layer, and a second electrode electrically connected to the photosensitive layer, wherein the at least one composite organic layer comprises a polymeric phase and a nanoparticle phase, the nanoparticle phase comprising at least one exaggerated nanocrystalline grain. A boosting layer is disposed between the photosensitive layer and first or second electrode. In embodiments wherein the photosensitive layer comprises a plurality of composite organic layers, a boosting layer can be disposed between composite organic layers of the photosensitive layer.

The present invention additionally provides methods for producing composite organic layers. In one embodiment, a method for producing a composite organic layer comprises dispersing a nanoparticle phase in a polymeric phase and forming at least one exaggerated nanocrystalline grain in the polymeric phase. Forming at least one exaggerated nanocrystalline grain, in some embodiments, comprises disposing the composite organic layer in an applied electric field and annealing the composite organic layer in a thermal gradient.

In another embodiment, a method for producing a composite organic layer comprises disposing a nanoparticle phase in a first solvent, disposing a polymeric phase in a second solvent at least partially immiscible with the first solvent, combining the first and second solvents, and precipitating at least one exaggerated nanocrystalline grain in the polymeric phase. In some embodiments, precipitation of at least one exaggerated nanocrystalline occurs in an applied electric field.

In another embodiment, a method for producing a composite organic layer comprises providing at least one exaggerated nanocrystalline grain and disposing the at least one nanocrystalline grain in a polymeric phase. In some embodiments, a method for producing a composite organic layer comprises providing a plurality of exaggerated nanocrystalline grains and dispersing the plurality of exaggerated nanocrystalline grains in a polymeric phase. In some embodiments, a method for producing a composite organic layer further comprises annealing the polymeric phase having exaggerated nanocrystalline grains disposed therein. In some embodiments, providing at least one exaggerated nanocrystalline grain comprises fabricating the at least one exaggerated nanocrystalline grain independent of and prior to disposition in the polymeric phase.

In an additional aspect, the present invention provides methods for producing photovoltaic cells. In one embodiment, a method for producing a photovoltaic cell comprises providing a radiation transmissive first electrode, disposing a photosensitive layer in electrical communication with the first electrode, the photosensitive layer comprising a plurality of composite organic layers, and disposing a second electrode in electrical communication with the photosensitive layer, wherein each of the plurality of composite organic layers comprises a polymeric phase and a nanoparticle phase, the nanoparticle phase comprising at least one exaggerated nanocrystalline grain. In some embodiments, a method of producing a photovoltaic cell further comprises disposing a boosting layer between the photosensitive layer and the first electrode and/or the second electrode. In other embodiments, a method of producing a photovoltaic cell further comprises disposing a boosting layer between any two of the plurality of composite organic layers.

In a further aspect, the present invention provides methods of converting electromagnetic energy into electrical energy. In one embodiment, a method for converting electromagnetic energy into electrical energy comprises exposing a photosensitive layer comprising a plurality of composite organic layers to electromagnetic radiation, generating excitons in at least one of the plurality of composite organic layers, wherein each of the plurality of composite organic layers comprises a polymeric phase and a nanoparticle phase, the nanoparticle phase comprising at least one exaggerated nanocrystalline grain. A method for converting electromagnetic energy into electrical energy further comprises separating excitons into holes and electrons at heterojunctions in the plurality of composite organic layers and passing the electrons into an external circuit.

DETAILED DESCRIPTION

Figure 1:
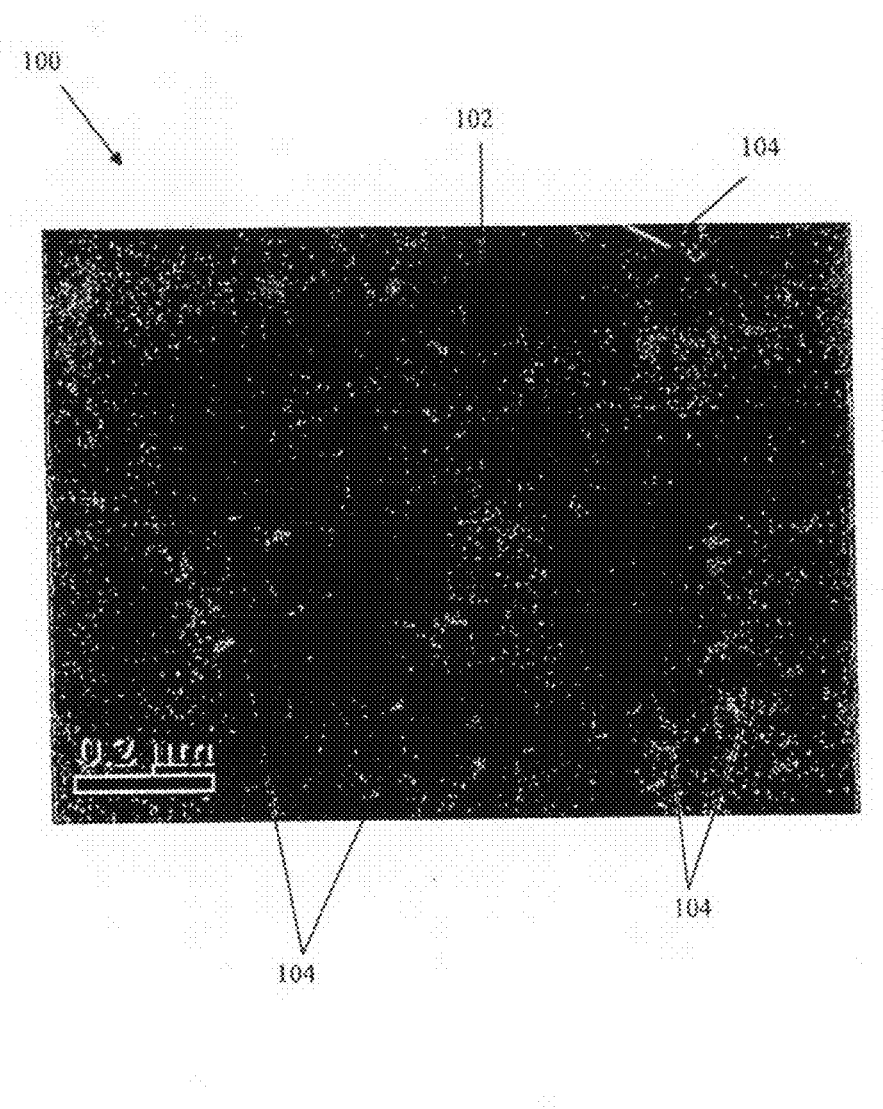
FIG. 1 illustrates a composite organic layer according to an embodiment of the present invention.

The present invention provides composite organic materials and optoelectronic devices, including photovoltaic devices, comprising the same.

In one embodiment, the present invention provides a composite organic layer comprising a polymeric phase and a nanoparticle phase, the nanoparticle phase comprising at least one exaggerated nanocrystalline grain. In some embodiments, the composite organic layer comprises a plurality of exaggerated nanocrystalline grains. Composite organic layers, according to embodiments of the present invention, can be used in the construction of a photosensitive layer of an optoelectronic device, including a photovoltaic device.

Turning now to components that can be included in various embodiments of composite organic layers of the present invention, composite organic layers comprise a polymeric phase. In some embodiments, the polymeric phase of a composite organic layer comprises one or more conjugated polymers. Conjugated polymers suitable for use in the polymeric phase, according to some embodiments, comprise polythiophenes, polyphenylenes, polyfluorenes, or combinations thereof. In some embodiments, conjugated polymers comprise poly(3-hexylthiophene) (P3HT), poly(3-octylthiophene) (P3OT), or polythiophene (PTh).

In other embodiments, the polymeric phase of a composite organic layer comprises one or more semiconducting polymers. Semiconducting polymers suitable for use in the polymeric phase, in some embodiments, comprise phenylene vinylenes, such as poly(phenylene vinylene), polyp-phenylene vinylene) (PPV), or derivatives thereof. In another embodiment, suitable semiconducting polymers comprise polyfluorenes, naphthalenes, and derivatives thereof. In a further embodiment, semiconducting polymers for use in the polymeric phase comprise poly(2-vinylpyridine) (P2VP), polyamides, poly(N-vinylcarbazole) (PVCZ), polypyrrole (PPy), or polyaniline (PAn). In some embodiments, semiconducting polymers comprise conjugated polymers.

In addition to the polymeric phase, composite organic layers of the present invention comprise a nanoparticle phase dispersed in the polymeric phase. In embodiments of the present invention, the nanoparticle phase comprises at least one exaggerated nanocrystalline grain. In some embodiments, the nanoparticle phase comprises a plurality of exaggerated nanocrystalline grains.

Exaggerated nanocrystalline grains, according to embodiments of the present invention, comprise a plurality of nanoparticles. In one embodiment, nanoparticles of an exaggerated nanocrystalline grain comprise carbon nanoparticles. Carbon nanoparticles, according to some embodiments, comprise multi-walled carbon nanotubes (MWNT), single-walled carbon nanotubes (SWNT), cut nanotubes, nanotubes comprising frequency converters, doped nanotubes, or mixtures thereof. In some embodiments, doped nanotubes comprise single and multi-walled carbon nanotubes doped with nitrogen and/or boron. In other embodiments, carbon nanoparticles of exaggerated nanocrystalline grains comprise fullerenes, including fullerene conjugates such as 1-(3-methoxycarbonyl)propyl-1-phenyl-(6,6)$C_{61}$ (PCBM), higher order fullerenes ($C_{70}$ and higher), and endometallofullerenes (fullerenes having at least one metal atom disposed therein). In some embodiments, an exaggerated nanocrystalline grain can comprise a plurality of different types of carbon nanoparticles. In one embodiment, for example, an exaggerated nanocrystalline grain can comprise doped and undoped carbon nanotubes.

In some embodiments, nanoparticles of exaggerated nanocrystalline grains comprise metal nanoparticles such as gold nanoparticles, silver nanoparticles, copper nanoparticles, nickel nanoparticles, and other transition metal nanoparticles. In a further embodiment, nanoparticles of exaggerated nanocrystalline grains comprise semiconductor nanoparticles such as III/V and II/VI semiconductor nanoparticles, including cadmium selenide (CdSe) nanoparticles, cadmium telluride (CdTe) nanoparticles, gallium nitride (GaN) nanoparticles, gallium arsenide (GaAs) nanoparticles, and indium phosphide (InP) nanoparticles.

Exaggerated nanocrystalline grains, in some embodiments, demonstrate high aspect ratios. In one embodiment, an exaggerated nanocrystalline grain can have a length ranging from about 10 nm to about 1 μm. In other embodiments, an exaggerated nanocrystalline grain can have a length ranging from about 100 nm to about 800 nm. In another embodiment, an exaggerated nanocrystalline grain can have a length ranging from about 200 nm to about 600 nm or from about 250 nm to about 500 nm. In a further embodiment, an exaggerated nanocrystalline grain can have a length greater than about 500 nm. In some embodiments, an exaggerated nanocrystalline grain has a length ranging from about 50 nm to about 100 nm or from about 100 nm to about 150 nm.

An exaggerated nanocrystalline grain, according to some embodiments, can have a diameter ranging from about 1 nm to about 300 nm. In other embodiments, an exaggerated nanocrystalline grain can have a diameter ranging from about 10 nm to about 150 nm. In another embodiment, an exaggerated nanocrystalline grain can have a diameter ranging from about 20 nm to about 80 nm or from about 30 nm to about 70 nm. In a further embodiment, an exaggerated nanocrystalline grain can have a diameter greater than about 50 nm.

Exaggerated nanocrystalline grains, in some embodiments, demonstrate high aspect ratios.

In addition to exaggerated nanocrystalline grains, a nanoparticle phase of a composite organic layer of the present invention can also comprise a plurality of individual nanoparticles, including carbon nanotubes, fullerenes, and conjugates and derivatives thereof.

A composite organic layer, in some embodiments of the present invention, has a weight ratio of polymeric phase to nanoparticle phase ranging from about 1:2 to about 1:0.3. In other embodiments, a composite organic layer has a ratio of polymeric phase to nanoparticle phase ranging from about 1:1 to about 1:0.6. In one embodiment, for example, the ratio of poly(3-hexylthiophene) to PCBM ranges from about 1:1 to about 1:0.4.

Composite organic layers, according to some embodiments of the present invention, further comprise one or more upconverters and/or downconverters. Upconverters suitable for use in the present invention, in some embodiments, absorb infrared radiation and emit visible radiation at wavelengths operable to be absorbed by composite organic layers of the present invention. Conversely, downconverters suitable for use in the present invention, in some embodiments, absorb ultraviolet radiation and emit visible radiation at wavelengths operable to be absorbed by composite organic layers of the present invention. Upconverter and/or downconverter materials, in some embodiments, are dispersed throughout the polymeric phase of the composite organic layers.

Upconverters, in some embodiments, can include materials comprising at least one Lanthanide series element. In some embodiments, upconverter materials comprise nanoparticles comprising at least one Lanthanide series element. Lanthanide series elements suitable for use in upconverter materials, according to some embodiments of the present invention, comprise erbium, ytterbium, dysprosium, holmium, or mixtures thereof. In some embodiments, upconverter materials comprise metal oxides and metal sulfides doped with ions of erbium, ytterbium, dysprosium, holmium, or mixtures thereof.

In other embodiments, upconverter materials comprise organic chemical species. Organic upconverter materials can comprise $H_2C_6N$ and 4-dialkylamino-1,8-naphthalimides as well as 1,8-naphthalimide derivatives and compounds, such as multibranched naphthalimide derivatives TPA-NA1, TPA-NA2, and TPA-NA3. Organic upconverter materials can also comprise 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl[4-[2-(4-nitrophenyl)ethenyl]phenyl]amino]ethanol, 4-dimethylamino-4'-nitrostilbene, Disperse Orange 25, Disperse Orange 3, and Disperse Red 1.

In a further embodiment, upconverter and/or downconverter materials can comprise quantum dots. Quantum dots, according to some embodiments, comprise III/V and II/VI semiconductor materials, such as cadmium selenide (CdSe), cadmium telluride (CdTe), and zinc selenide (ZnSe). Upconverter materials can also comprise core-shell architectures of quantum dots. The inclusion of III/V and II/VI semiconductor materials as upconverters in a composite organic layer is separate from their use in an exaggerated nanocrystalline grain as contemplated herein.

In some embodiments, downconverters for use in the present invention can comprise nanphosphor materials, including yttrium oxides embedded with Lanthanide series elements such as $Y_2O_3:Eu^{3+}$, $Y_2O_3:Tb^{3+}$, and $Y_2O_3:Ce^{3+}$. Nanophosphor materials, in some embodiments, also comprise zinc oxides and/or aluminum oxides embedded with metals, including Lanthanide series elements, as well as transition metals.

In some embodiments, a composite organic layer can further comprise small molecules. In one embodiment, small molecules suitable for use in a composite organic layer comprise coumarin 6, coumarin 30, coumarin 102, coumarin 110, coumarin 153, and coumarin 540. In another embodiment, small molecules suitable for use in a composite organic layer of the present invention comprise 9,10-dihydrobenzo[a]pyrene-7(8H)-one, methylbenzo[a]pyrene, pyrene, benzo[e]pyrene, 3,4-dihydroxy-3-cyclobutene-1,2-dione, and 1,3-bis[4-(dimethylamino)phenyl-2,4-dihydroxycyclobutenediylium dihydroxide.

A composite organic layer, according to some embodiments of the present invention, has thickness ranging from about 30 nm to about 1 μm. In other embodiments, a composite organic layer has a thickness ranging from about 80 nm to about 800 nm. In another embodiment, a composite organic layer has a thickness ranging from about 100 nm to about 500 nm or from about 150 nm to about 450 nm. In a further embodiment, a composite organic layer has a thickness ranging from about 50 nm to about 300 nm or from about 40 nm to about 125 nm. In one embodiment, a composite organic layer has a thickness ranging from about 80 nm to about 150 nm.

FIG. 1 illustrates a composite organic layer according to an embodiment of the present invention. As displayed in FIG. 1, the composite organic layer (100) comprises a polymeric phase (102) and a nanoparticle phase comprising a plurality of exaggerated nanocrystalline grains (104) dispersed throughout the polymeric phase (102).

In another aspect, the present invention provides photovoltaic cells. In some embodiments, a photovoltaic cell comprises a radiation transmissive first electrode, a photosensitive layer electrically connected to the first electrode, the photosensitive layer comprising a plurality of composite organic layers, wherein each of the plurality of composite organic layers comprises a polymeric phase and a nanoparticle phase, the nanoparticle phase comprising at least one exaggerated nanocrystalline grain. A second electrode is electrically connected to the photosensitive layer.

A photovoltaic cell, in another embodiment, comprises a radiation transmissive first electrode, a photosensitive layer electrically connected to the first electrode, the photosensitive layer comprising a first composite organic layer and a second composite organic layer, wherein the first and second composite organic layers each comprise a polymeric phase and a nanoparticle phase, the nanoparticle phase comprising at least one exaggerated nanocrystalline grain. A second electrode is electrically connected to the photosensitive layer.

In a further embodiment, a photovoltaic cell comprises a radiation transmissive first electrode, a photosensitive layer electrically connected to the first electrode, the photosensitive layer comprising at least one composite organic layer, and a second electrode electrically connected to the photosensitive layer, wherein the at least one composite organic layer comprises a polymeric phase and a nanoparticle phase, the nanoparticle phase comprising at least one exaggerated nanocrystalline grain. In some embodiments, a boosting layer is disposed between the photosensitive layer and first or second electrode. In embodiments wherein the photosensitive layer comprises a plurality of composite organic layers, a boosting layer can be disposed between composite organic layers of the photosensitive layer.

Turning now to components that can be included in photovoltaic cells of the present invention, photovoltaic voltaic cells of the present invention comprise a radiation transmissive first electrode. Radiation transmissive, as used herein, refers to the ability to at least partially pass radiation in the visible, near infrared, and/or near ultraviolet region of the electromagnetic spectrum. In some embodiments, radiation transmissive materials can pass visible electromagnetic radiation with minimal absorbance or other interference.

Moreover, electrodes, as used herein, refer to layers that provide a medium for delivering photo-generated current to an external circuit or providing bias voltage to the optoelectronic device. An electrode provides an interface between the photosensitive layer comprising at least one composite organic layer of a photovoltaic cell and a wire, lead, trace, or other means for transporting the charge carriers to or from the external circuit.

A radiation transmissive first electrode, according to some embodiments of the present invention, comprises a radiation transmissive conducting oxide. Radiation transmissive conducting oxides, in some embodiments, can comprise indium tin oxide (ITO), gallium indium tin oxide (GITO), and zinc indium tin oxide (ZITO). In another embodiment, the radiation transmissive first electrode can comprise a radiation transmissive polymeric material such as polyanaline (PANI) and its chemical relatives. In some embodiments, 3,4-polyethylenedioxythiophene (PEDOT) can be a suitable radiation transmissive polymeric material for the first electrode. In other embodiments, a radiation transmissive first electrode can comprise a metal or carbon nanotube layer having a thickness operable to at least partially pass visible electromagnetic radiation.

In some embodiments, a radiation transmissive first electrode has a thickness ranging from about 10 nm to about 1 μm. In other embodiments, a radiation transmissive first electrode has a thickness ranging from about 100 nm to about 900 nm. In another embodiment, a radiation transmissive first electrode has a thickness ranging from about 200 nm to about 800 nm. In one embodiment, a radiation transmissive first electrode has a thickness ranging from about 1 μm to about 10 μm. In a further embodiment, a radiation transmissive first electrode has a thickness greater than 10 μm.

In addition to a radiation transmissive first electrode, photovoltaic cells of the present invention also comprise a photosensitive layer electrically connected to the radiation transmissive first electrode. Electrically connected, as used herein, refers to the ability of the photosensitive layer to receive charge carriers from and pass charge carriers to an electrode. A photosensitive layer, according to embodiments of the present invention, comprises at least one composite organic layer, the composite organic layer comprising a polymeric phase and a nanoparticle phase, the nanoparticle phase comprising at least one exaggerated nanoparticle grain. In some embodiments, a photosensitive layer comprises a plurality of composite organic layers. In one embodiment, a photosensitive layer comprises a first composite organic layer and a second composite organic layer.

Composite organic layers, according to embodiments of the present invention, are operable to absorb radiation in the ultra-violet, visible, and infrared regions of the electromagnetic spectrum. Excitons are generated in a composite organic layer upon absorption of electromagnetic radiation. Exciton dissociation can be precipitated at bulk heterojunctions in the composite organic layer. Bulk heterojunctions are formed between adjacent donor and acceptor materials in the composite organic layer.

In the context of organic materials, the terms donor and acceptor refer to the relative positions of the highest occupied molecular orbital (HOMO) and lowest unoccupied molecular orbital (LUMO) energy levels of two contacting but different organic materials. This is in contrast to the use of these terms in the inorganic context, where donor and acceptor may refer to types of dopants that may be used to create inorganic n- and p-type layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

In embodiments of the present invention, the polymeric phase of the composite organic layer serves as a donor material and the nanoparticle phase serves as the acceptor material thereby forming heterojunctions operable for the separation of excitons into holes and electrons. Heterojunctions, according to embodiments of the present invention, are formed between polymers of the polymeric phase and nanoparticles, including exaggerated nanocrystalline grains, of the nanoparticle phase dispersed throughout the polymeric phase. In some embodiments, the high aspect ratio and crystalline structure of exaggerated nanocrystalline grains provide separated excitons (electrons) a faster pathway to an electrode thereby decreasing the likelihood of recombination and enhancing photovoltaic cell efficiency.

In some embodiments, a photosensitive layer comprises a plurality of composite organic layers. In one embodiment, a photosensitive layer comprises a first composite organic layer and a second composite organic layer. The polymeric phases of the first and second composite organic layers, in some embodiments, are chosen such that the first and second layers have non-overlapping spectral absorbences, thereby increasing the electromagnetic absorption range of the photosensitive layer. In other embodiments, the polymeric phases of the first and second composite organic layers are chosen such that the first and second layers have at least partially overlapping spectral absorbences. Embodiments of the present invention contemplate non-overlapping and/or overlapping spectral absorbences of a plurality of composite organic layers in a photosensitive layer, including three, four, five, and greater than five composite organic layers.

Composite organic layers of a photosensitive layer, according to some embodiments of the present invention, demonstrate varying ratios of polymeric phase to nanoparticle phase. Varying the ratio of polymeric phase to nanoparticle phase in composite organic layers of a photosensitive layer changes charge carrier mobility, such as electron mobility, across the photovoltaic device and can better maintain charge balance. In one embodiment, for example, a photosensitive layer comprises a first composite organic layer and a second composite organic layer having varying ratios of polymeric phase to nanoparticle phase. The first composite organic layer has a ratio of polymeric phase to nanoparticle phase of 1:0.8, and the second composite organic layer has a ratio of polymeric phase to nanoparticle phase of 1:1.

In addition to varying ratios, composite organic layers of a photosensitive layer, in some embodiments, can be constructed independently from one another. In such embodiments, polymeric and/or nanoparticle phases of one composite organic layer are selected without reference to the polymeric and/or nanoparticle phases of another composite organic layer. Composite organic layer construction can be varied in any manner consistent with the materials and methods described herein.

In some embodiments of a photosensitive layer comprising a plurality of composite organic layers, a metal layer can be disposed at the interface of adjacent composite organic layers. In other embodiments, a metal layer can be disposed at the interface of a composite organic layer and a boosting layer. Metals can comprise gold, silver, copper, aluminum, platinum, other transition metals, noble metals, or alloys thereof. In one embodiment, a metal layer comprises a plurality of metal nanoparticles. In some embodiments, metal nanoparticles have an average diameter ranging from about 1 nm to about 50 nm, from about 5 nm to about 30 nm or from about 10 nm to about 20 nm. In one embodiment, metal nanoparticles have an average diameter ranging from about 5 nm to about 15 nm. Metal nanoparticles, in some embodiments, are dispersed in a solvent and spin coated on a composite organic layer.

In other embodiments, a polymeric layer comprising polyethylenedioxythiophene (PEDOT) can be disposed at the interface of adjacent composite organic layers and/or a boosting layer. In one embodiment, for example, a PEDOT layer is disposed at the interface of a first composite organic layer and a second composite organic layer. In some embodiments, a metal layer or PEDOT layer can further comprise quantum dots. In one embodiment, a PEDOT layer has a thickness ranging from about 0.2 nm to about 200 nm. In another embodiment, a PEDOT layer has a thickness ranging from about 0.5 nm to about 100 nm, from about 1 nm to about 50 nm, or from about 10 nm to about 30 nm.

Photosensitive layers comprising at least one composite organic layer, in some embodiments, have a thickness ranging from about 50 nm to about 5 μm. In other embodiments, a photosensitive layer has a thickness ranging from about 100 nm to about 500 nm. In another embodiment, a photosensitive layer has a thickness ranging from about 150 nm to about 300 nm. In a further embodiment, a photosensitive layer has a thickness ranging from about 200 nm to about 250 nm. In some embodiments, a photosensitive layer has a thickness ranging from about 50 nm to about 150 nm or from about 80 nm to about 120 nm, In one embodiment, a photosensitive layer has a thickness less than about 50 nm or greater than about 5 μm.

Photovoltaic cells of the present invention comprise a second electrode electrically connected to the photosensitive layer. In some embodiments, the second electrode can comprise a metal. As used herein, metal refers to both materials composed of an elementally pure metal, e.g., gold, and also metal alloys comprising materials composed of two or more elementally pure materials. In some embodiments, the second electrode comprises gold, silver, aluminum, or copper. The second electrode, according to some embodiments, can have a thickness ranging from about 10 nm to about 10 μm. In other embodiments, the second electrode can have a thickness ranging from about 100 nm to about 1 μm or from about 200 nm to about 800 nm. In a further embodiment, the second electrode can have a thickness ranging from about 50 nm to about 500 nm. In one embodiment, the second electrode has a thickness less than about 10 nm to greater than about 10 μm.

A layer comprising lithium fluoride (LiF), according to some embodiments, can be disposed between the photosensitive layer and second electrode. The LiF layer can have a thickness ranging from about 1 angstrom to about 5 nm or from about 1 angstrom to about 1 nm.

In some embodiments, the LiF layer can be at least partially oxidized resulting in a layer comprising lithium oxide ($Li_2O$) and LiF. In other embodiments, the LiF layer can be completely oxidized resulting in a lithium oxide layer deficient or substantially deficient of LiF. In some embodiments, a LiF layer is oxidized by exposing the LiF layer to oxygen, water vapor, or combinations thereof. In one embodiment, for example, a LiF layer is oxidized to a lithium oxide layer by exposure to an atmosphere comprising water vapor and/or oxygen at a partial pressures of less than about $10^{-6}$ Torr. In another embodiment, a LiF layer is oxidized to a lithium oxide layer by exposure to an atmosphere comprising water vapor and/or oxygen at a partial pressures less than about $10^{-7}$ Torr or less than about $10^{-8}$ Torr.

In some embodiments, a LiF layer is exposed to an atmosphere comprising water vapor and/or oxygen for a time period ranging from about 1 hour to about 15 hours. In one embodiment, a LiF layer is exposed to an atmosphere comprising water vapor and/or oxygen for a time period greater than about 15 hours. In a further embodiment, a LiF layer is exposed to an atmosphere comprising water vapor and/or oxygen for a time period less than about one hour. The time period of exposure of the LiF layer to an atmosphere comprising water vapor and/or oxygen, according to some embodiments of the present invention, is dependent upon the partial pressures of the water vapor and/or oxygen in the atmosphere. The higher the partial pressure of the water vapor or oxygen, the shorter the exposure time.

Photovoltaic cells of the present invention, in some embodiments, further comprise additional layers such as one or more exciton blocking layers. In embodiments of the present invention, an exciton blocking layer (EBL) can act to confine photogenerated excitons to the region near the dissociating interface and prevent parasitic exciton quenching at a photosensitive organic/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render an organic photovoltaic device inoperable.

An EBL, according to some embodiments of the present invention, comprises a polymeric material. In one embodiment, an EBL can comprise polyethylenedioxythiophene:polystyrenesulfonate (PEDOT:PSS). In another embodiment, an EBL comprises a composite material. In one embodiment, an EBL comprises nanoparticles, including carbon nanoparticles, dispersed in 3,4-polyethylenedioxythiophene:polystyrenesulfonate (PEDOT:PSS). In another embodiment, an EBL comprises carbon nanoparticles dispersed in poly(vinylidene chloride) and copolymers thereof. Carbon nanoparticles, in some embodiments, dispersed in the polymeric phases including PEDOT:PSS and poly(vinylidene chloride) can comprise single-walled nanotubes, multi-walled nanotubes, fullerenes, or mixtures thereof. In further embodiments, EBLs can comprise any polymer having a work function energy operable to permit the transport of holes while impeding the passage of electrons. In some embodiments, an EBL may be disposed between the radiation transmissive first electrode and a composite organic layer of a photovoltaic cell.

In some embodiments, a photovoltaic cell can be disposed on a rigid or flexible radiation transmissive substrate. A rigid substrate, according to some embodiments, can comprise glass, a thermoplastic, thermoset, or metal.

Figure 2:
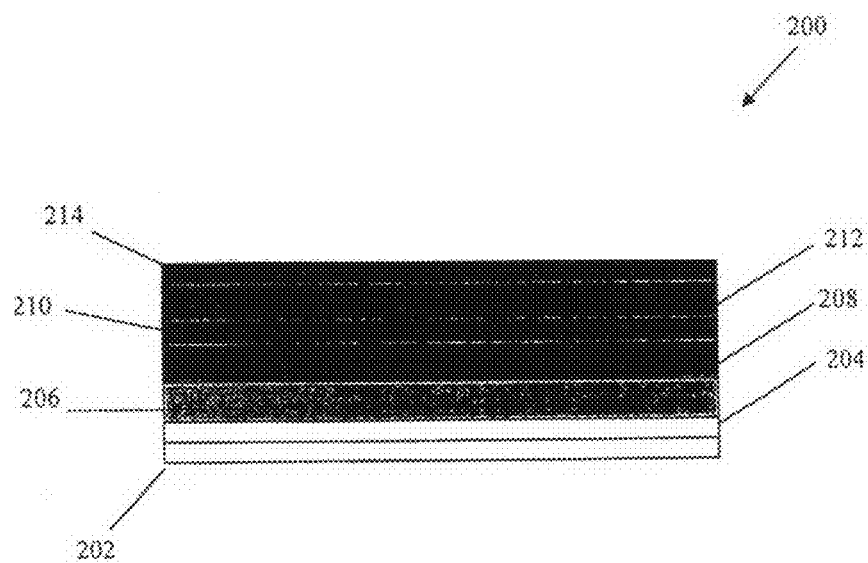
FIG. 2 illustrates a photovoltaic cell according to an embodiment of the present invention.

FIG. 2 illustrates a cross-sectional view of a photovoltaic cell according to an embodiment of the present invention. The photovoltaic cell (200) shown in FIG. 2 comprises a radiation transmissive substrate (202) and a radiation transmissive first electrode (204) comprising a conducting oxide, such as indium tin oxide, gallium indium tin oxide, or zinc indium tin oxide. An exciton blocking layer is (206) is disposed over the radiation transmissive first electrode (204). As provided herein, in some embodiments, the exciton blocking layer (206) can comprise PEDOT. The exciton blocking layer is covered by a first composite organic layer (208) comprising a first polymeric phase and a first nanoparticle phase, the first nanoparticle phase comprising at least one exaggerated nanocrystalline grain. A metal layer (210) covers the first composite organic layer.

A second composite organic layer (212) is disposed above the metal layer (210), the second composite organic layer (212) comprising a second polymeric phase and a second nanoparticle phase, the second nanoparticle phase comprising at least one exaggerated nanocrystalline grain. A second electrode (214) resides above the second composite organic layer. In some embodiments, the second electrode (214) comprises a metal such as aluminum, gold, silver, nickel, or copper.

In some embodiments of a photovoltaic cell, a boosting layer is disposed between the photosensitive layer and first or second electrode. In embodiments wherein the photosensitive layer comprises a plurality of composite organic layers, a boosting layer can be disposed between composite organic layers of the photosensitive layer.

A boosting layer, according to some embodiments, comprises pyroelectric materials, piezoelectric materials, electret materials, conjugated polymeric materials or combinations thereof. In some embodiments, pyroelectric and/or piezoelectric materials comprise polymeric materials. In one embodiment, for example, the boosting layer comprises polyvinyl fluoride (PVF), polyvinylidene fluoride (PVDF), or combinations thereof. In some embodiments, an electret material comprises benzocyclobutene (BCB), perfluorocyclobutene (PFCB), nanoemulsion-based PTFE, or combinations thereof. Moreover, conjugate polymeric materials suitable for use as a boosting layer, according to some embodiments, comprise polyacetylene, poly(phenylene vinlylene), polypphenylene vinylene) (PPV), poly(3-hexylthiophene), poly(3-octylthiophene), polythiophene, polyaniline, or combinations thereof.

In one embodiment, a boosting layer comprises a composite material, the composite material comprising a polymeric phase and a nanoparticle phase. In some embodiments, the nanoparticle phase of a boosting layer comprises carbon nanoparticles including, but not limited to, MWNT, SWNT, cut nanotubes, nanotubes comprising frequency converters, doped nanotubes, fullerenes, fullerene conjugates, higher order fullerenes, endometallofullerenes or mixtures thereof. Moreover, in some embodiments, the polymeric phase of a boosting layer composite material comprises any of the polymeric materials provided herein. In one embodiment, a composite material of a boosting layer does not comprise an exaggerated nanocrystalline grain.

A boosting layer, in some embodiments, can add the offset voltage of the pyroelectric, piezoelectric, conjugated polymer and/or electret material thereby creating a higher $V_{oc}$ and allowing for the use of smaller bandgap materials in the photosensitive layer without losing efficiency. A boosting layer, in some embodiments, has a thickness ranging from about 0.5 nm to 50 nm or from about 1 nm to about 40 nm. In another embodiment, a boosting layer has a thickness ranging from about 5 nm to about 30 nm or from about 10 nm to about 20 nm. In a further embodiment, a boosting layer has a thickness less than about 0.5 nm or greater than about 50 nm.

In some embodiments, boosting layers are applied by spin coating. In one embodiment, for example, a layer of a photovoltaic cell being spin coated with a boosting layer is roughed prior to the spin coating process. Roughening the layer to be coated, in some embodiments, can increase the adhesion characteristics of the boosting layer. In one embodiment, a layer to be spin coated with a boosting layer can be roughened by applying an elastomeric material to the layer and subsequently peeling off the elastomeric material.

Figure 3:
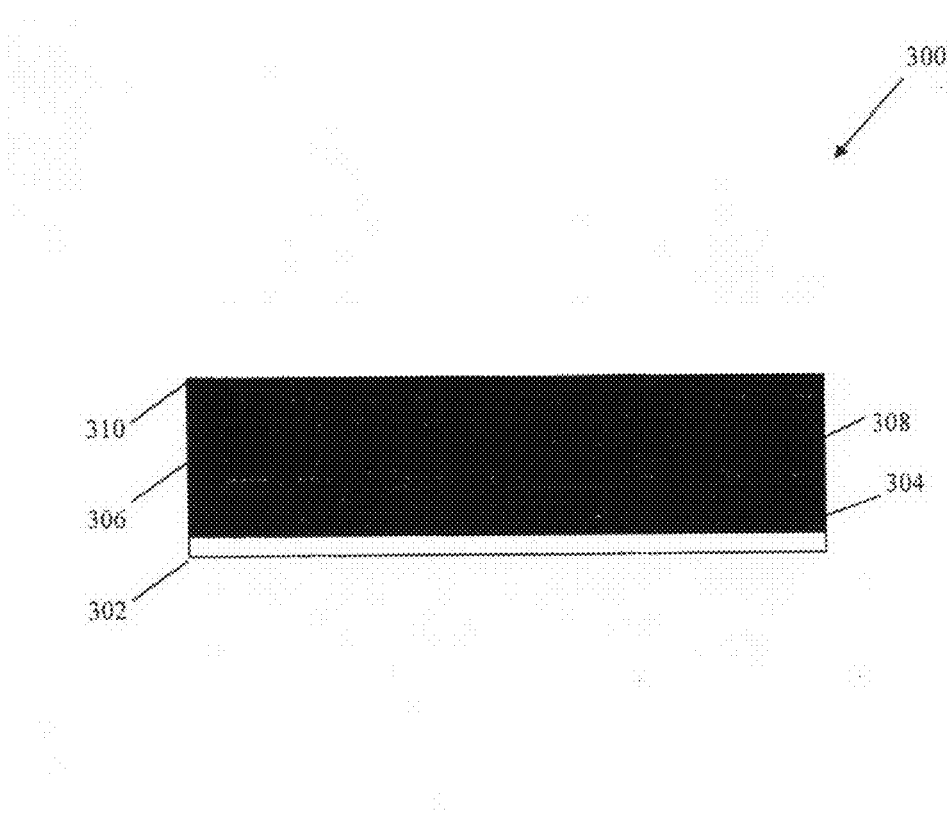
FIG. 3 illustrates a photovoltaic cell according to an embodiment of the present invention.

FIG. 3 illustrates a cross-section of a photovoltaic device comprising a boosting layer according to an embodiment of the present invention. The photovoltaic device (300) shown in FIG. 3 comprises a radiation transmissive first electrode (302) comprising a conducting oxide, such as indium tin oxide, gallium indium tine oxide, or zinc indium tin oxide. A photosensitive layer (304) comprising a composite organic layer is disposed over the radiation transmissive first electrode (302). The composite organic layer comprises a polymeric phase and a nanoparticle phase as described herein.

The photosensitive layer (304) is covered by a metal layer (306). Metals suitable for use in the metal layer (306), in some embodiments, comprise gold, silver, platinum, copper, aluminum, nickel, other transition and noble metals and/or alloys thereof. A boosting layer (308) is disposed above the metal or polymeric layer (306) followed by a second electrode (310).

Photovoltaic cells, according to some embodiments of the present invention, can display a fill factor greater than about 0.2. In other embodiments, a photovoltaic cells can demonstrate a fill factor greater than about 0.5. In a further embodiment, a photovoltaic cells can display a fill factor greater than about 0.7.

In some embodiments, a photovoltaic cell of the present invention can display a conversion efficiency, $\eta_p$, greater than about 4%. Photovoltaic cells of the present invention, in other embodiments, can display a conversion efficiency greater than about 5%. In a further embodiment, a photovoltaic cell of the present invention can demonstrate a conversion efficiency greater than about 6%.

In another aspect, the present invention provides a photoactive apparatus comprising at least one pixel comprising at least one photovoltaic cell, the photovoltaic cell comprising a radiation transmissive first electrode, a photosensitive layer electrically connected to the first electrode, the photosensitive layer comprising a plurality of composite organic layers, wherein each of the plurality of composite organic layers comprises a polymeric phase and a nanoparticle phase, the nanoparticle phase comprising at least one exaggerated nanocrystalline grain. A second electrode is electrically connected to the photosensitive layer. In some embodiments, a photoactive apparatus comprises a plurality of pixels.

In another embodiment, a photoactive apparatus comprises at least one pixel comprising at least one photovoltaic cell, the photovoltaic cell comprising a radiation transmissive first electrode, a photosensitive layer electrically connected to the first electrode, the photosensitive layer comprising a first composite organic layer and a second composite organic layer, wherein the first and second composite organic layers each comprise a polymeric phase and a nanoparticle phase, the nanoparticle phase comprising at least one exaggerated nanocrystalline grain. A second electrode is electrically connected to the photosensitive layer.

In a further embodiment, a photoactive apparatus comprises at least one pixel comprising at least one photovoltaic cell, the photovoltaic cell comprising a radiation transmissive first electrode, a photosensitive layer electrically connected to the first electrode, the photosensitive layer comprising at least one composite organic layer, and a second electrode electrically connected to the photosensitive layer, wherein the at least one composite organic layer comprises a polymeric phase and a nanoparticle phase, the nanoparticle phase comprising at least one exaggerated nanocrystalline grain. A boosting layer is disposed between the photosensitive layer and first or second electrode.

In some embodiments, a pixel comprises a plurality of photovoltaic cells. In other embodiments, a photoactive apparatus comprises a plurality of pixels. In a further embodiment, a photoactive device comprises an array of pixels, each pixel comprising a plurality of photovoltaic cells. In some embodiments, a photoactive apparatus comprises a solar array.

Photovoltaic cells for use in pixel applications, in some embodiments of the present invention, are constructed independently from one another. In such embodiments, component materials for one photovoltaic cell are selected without reference to component materials selected for another photovoltaic cell. In one embodiment, for example, photovoltaic cells can comprise different conjugated polymers having non-overlapping spectral absorbances. As a result, in some embodiments, pixels and pixel arrays are not required to comprise photovoltaic cells of identical construction. Photovoltaic cell construction can be varied in any manner consistent with the materials and methods described herein to produce pixels and pixel arrays suitable for a wide range of applications.

In another aspect, the present invention provides methods for producing composite organic layers. In one embodiment, a method for producing a composite organic layer comprises dispersing a nanoparticle phase in a polymeric phase and forming at least one exaggerated nanocrystalline grain in the polymeric phase. Forming at least one exaggerated nanocrystalline grain, in some embodiments, comprises disposing the composite organic layer in an applied electric field and annealing the composite organic layer. In some embodiments, annealing comprises producing a thermal gradient across the composite organic layer.

In some embodiments, disposing a composite organic layer in an applied electric field comprises applying a voltage across the composite organic layer. Electrodes can be attached to the composite organic layer and connected to a DC power supply operable to deliver amps of current and establishing more than 100V. Voltages applied to a composite organic layer can range from about 50V to about 200V depending on the thickness of the composite organic layer.

In some embodiments, annealing comprises producing a thermal gradient across the composite organic layer. In some embodiments, a thermal gradient can be established by heating one side of the composite organic layer while maintaining the opposing side of the composite organic layer at a constant temperature or cooling the opposing side.

In one embodiment, for example, one side of a composite organic layer can be exposed and/or heated to a temperature within about 5% to about 30% of the glass transition temperature ($T_g$) of the polymeric phase while the opposing side is held at or cooled to room temperature. In another embodiment, one side of a composite organic layer can be exposed and/or heated to a temperature within about 10% to about 20% of the glass transition temperature of the polymeric phase while the opposing side is held at or cooled to room temperature. In some embodiments, one side of a composite organic layer can be exposed and/or heated to a temperature equal to or in excess of the glass transition temperature of the polymeric phase while the opposing side is held at or cooled to room temperature.

In other embodiments, one side of a composite organic layer can be exposed and/or heated to a temperature within about 5% to about 30% of the glass transition temperature of the polymeric phase while the opposing side is held at or cooled to a temperature ranging from about room temperature to about liquid nitrogen temperatures. In a further embodiment, one side of a composite organic layer can be exposed and/or heated to a temperature within about 10% to about 20% of the glass transition temperature of the polymeric phase while the opposing side is held at or cooled to a temperature ranging from about room temperature to about liquid nitrogen temperatures. In some embodiments, one side of a composite organic layer can be exposed and/or heated to a temperature equal to or in excess of the glass transition temperature of the polymeric phase while the opposing side is held at or cooled to a temperature ranging from about room temperature to about liquid nitrogen temperatures. The temperature difference between the heated side of the composite organic layer and the opposing unheated side can be varied depending factors such as thickness of the composite organic layer, loading of the nanoparticle phase in the polymeric phase, and heating times.

In some embodiments, a composite organic layer can be annealed in a thermal gradient for a time period ranging from about 30 seconds to about one hour. In another embodiment, a composite organic layer can be annealed for a time period ranging from about 45 seconds to about 30 minutes, from about 1 minute to about 10 minutes, or from about 2 minutes to about 7 minutes. In a further embodiment, a composite organic layer can be annealed for a time period less than or equal to about 5 minutes. In one embodiment, a composite organic layer can be annealed for a time period ranging from about 2 minutes to about 3 minutes. In some embodiments, a composite organic layer can be annealed for a time period greater than about 30 minutes.

In one embodiment, for example, one side of a polymeric phase comprising P3HT can be heated at 158° C. for 8-10 minutes. In another embodiment, one side of a polymeric phase comprising P3HT can be heated at 158° C. for 5-7 minutes.

Figure 4:
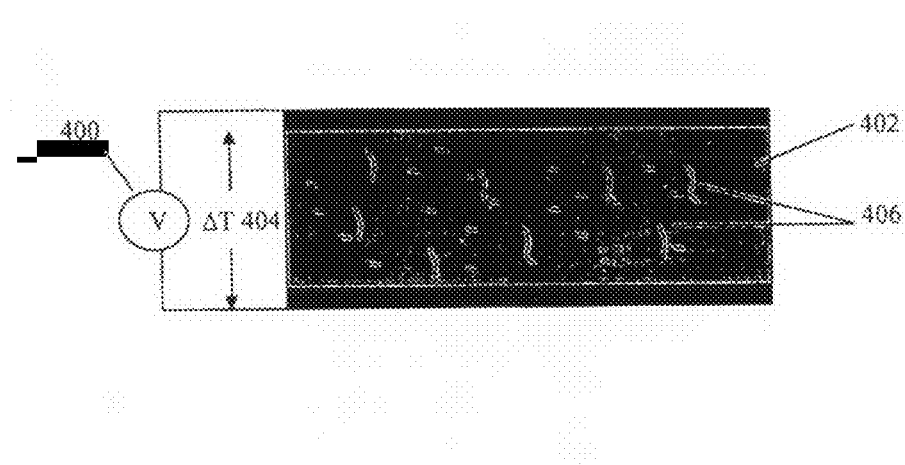
FIG. 4 illustrates a method of forming at least one nanocrystalline grain in the polymeric phase according to an embodiment of the present invention.

FIG. 4 illustrates a method of forming at least one nanocrystalline grain in the polymeric phase according to an embodiment of the present invention. A voltage (400) is applied across the composite organic layer (402) comprising a polymeric phase and a nanoparticle phase to produce an electric field. A thermal gradient (404) is established across the composite organic layer (402) during the annealing process in accordance with embodiments described above. Exaggerated nanocrystalline grains (406) form during the annealing process. In some embodiments, the exaggerated nanocrystalline grains at least partially align in the polymeric phase. Exaggerated nanocrystalline grains, in some embodiments, are substantially vertically aligned or oriented in the polymeric phase, thereby improving electron mobility.

While not wishing to be bound to any theory, it is believed that several processes occur when a composite organic layer comprising a polymeric phase and a nanoparticle phase is disposed in an applied electric field and annealed in a thermal gradient approaching the glass transition temperature of the polymeric phase. First, the polymeric phase undergoes at least some crystallization thereby increasing hole mobilities within the polymeric phase. Second, exaggerated nanocrystalline grains comprising a plurality of nanoparticles form in the polymeric phase as a result of exaggerated or abnormal grain growth processes, and the exaggerated nanocrystalline grains least partially align in the applied electric field.

In another embodiment, a method for producing an a composite organic layer comprises disposing a nanoparticle phase in a first solvent, disposing a polymeric phase in a second solvent at least partially immiscible with the first solvent, combining the first and second solvents, and precipitating at least one exaggerated nanocrystalline grain in the polymeric phase. In some embodiments, precipitation of at least one exaggerated nanocrystalline grain occurs in an applied electric field. Once formed, the composite organic layer, in some embodiments, can be dried in accordance with supercritical drying conditions.

Solvents suitable for the nanoparticle phase, according to some embodiments, comprise pyridine solutions. Moreover, solvents suitable for the polymeric phase, in some embodiments, comprise isopropyl alcohol solutions.

Figure 5:
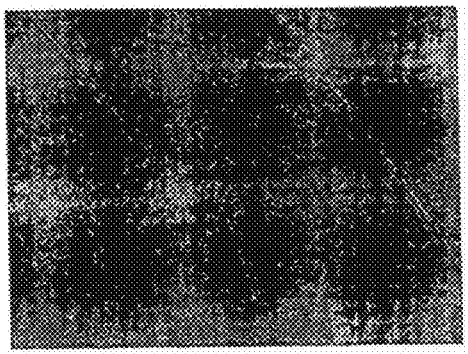
FIG. 5 illustrates exaggerated nanocrystalline grains formed through the combination of immiscible solvents according to an embodiment of the present invention.
Figure 5:

FIG. 5 illustrates exaggerated nanocrystalline grains formed through the combination of immiscible solvents according to one embodiment of the present invention.

In a further embodiment, a method for producing a composite organic layer comprises providing at least one exaggerated nanocrystalline grain and disposing the at least one exaggerated nanocrystalline grain in a polymeric phase. In another embodiment, a method for producing a composite organic layer comprises providing a plurality of exaggerated nanocrystalline grains and dispersing the plurality of nanocrystalline grains throughout a polymer phase.

Exaggerated nanocrystalline grains for disposition in a polymeric phase, in some embodiments, can be produced by the combination of immiscible solvents as provided herein, wherein the solvents do not comprise a polymeric phase. Once precipitated, the exaggerated nanocrystalline grains can be irradiated with ultraviolet light for stabilization. Irradiation with ultraviolet light, in some embodiments, can reduce the diameter of an exaggerated nanocrystalline grain. In one embodiment, irradiation with ultraviolet light can produce exaggerated nanocrystalline grains having a diameter of less than 100 nm. In another embodiment, irradiation with ultraviolet light can produce exaggerated nanocrystalline grains having a diameter of less than 50 nm.

In another aspect, the present invention provides methods for producing photovoltaic cells. In one embodiment, a method for producing a photovoltaic cell comprises providing a radiation transmissive first electrode, disposing a photosensitive layer in electrical communication with the first electrode, the photosensitive layer comprising a plurality of composite organic layers, and disposing a second electrode in electrical communication with the photosensitive layer, wherein each of the plurality of composite organic layers comprises a polymeric phase and a nanoparticle phase, the nanoparticle phase comprising at least one exaggerated nanocrystalline grain. In some embodiments, a method of producing a photovoltaic cell further comprises disposing a boosting layer between the photosensitive layer and the first electrode and/or the second electrode. In other embodiments, a method of producing a photovoltaic cell further comprises disposing a boosting layer between any two of the plurality of composite organic layers.

In a further aspect, the present invention provides methods of converting electromagnetic energy into electrical energy. In one embodiment, a method for converting electromagnetic energy into electrical energy comprises exposing a photosensitive layer comprising a plurality of composite organic layers to electromagnetic radiation, generating excitons in at least one of the plurality of composite organic layers, wherein each of the plurality of composite organic layers comprises a polymeric phase and a nanoparticle phase, the nanoparticle phase comprising at least one exaggerated nanocrystalline grain. A method for converting electromagnetic energy into electrical energy further comprises separating excitons into holes and electrons at heterojunctions in the plurality of composite organic layers and passing the electrons into an external circuit.

In some embodiments, a heterojunction comprises a plurality of bulk heterojunctions. As discussed herein, a bulk heterojunction is formed at the interface of a donor material and an acceptor material. In some embodiments, a donor material comprises a polymeric phase and the acceptor material comprises the nanoparticle phase. In one embodiment, a bulk heterojunction can be formed at the interface of the polymeric phase and at least one exaggerated nanocrystalline grain. In other embodiments, a bulk heterojunction can be formed at the interface the polymeric phase and a nanoparticle of the nanoparticle phase, such as a carbon nanotube or a fullerene, not associated with an exaggerated crystalline grain.

It is to be understood that the foregoing description and specific embodiments are merely illustrative of the present invention and the principles thereof, and that various modifications and additions may be made to the present invention by those skilled in the art, without departing from the spirit and scope of the invention.

Example 1

Photovoltaic Cell

A non-limiting example of a photovoltaic cell of the present invention was prepared according to the following procedure.

A photovoltaic cell of the present invention was prepared by spin casting poly(3,4-ethylenedioxythiophene):poly(styrenesulfonate) (PEDOT:PSS) (Baytron P) onto a cleaned indium tin oxide (ITO) substrate (Delta Technologies $R_S$=10 Ohm square$^{-1}$) at 4,000 rpm. The PEDOT to PSS ratio was 60:40. The resulting PEDOT:PSS layer had a thickness of about 40 nm and was annealed at 200° C. for 5 minutes. A blend of regioregular P3HT (Aldrich: regioregular with an average molecular weight, $M_w$=87 kg mol$^{-1}$, without further purification) and PCBM (American Dye Source) was subsequently spin coated onto the PEDOT:PSS layer at 2000 rpm. The weight ratio of P3HT to PCBM was about 1:0.66 and the resulting layer had a thickness of about 50 nm.

A second PEDOT:PSS layer was spin coated at 4,000 rpm on the P3HT:PCBM layer. The ratio of PEDOT to PSS was 60:40, and the resulting layer had a thickness of about 40 nm. Moreover, a second P3HT:PCBM layer was spin coated onto the second PEDOT:PSS layer at 2000 rpm. The ratio of P3HT to PCBM was about 1:0.66 and the resulting layer had a thickness of about 50 nm. An aluminum cathode was evaporated onto the second P3HT:PCBM layer at 10$^{-6}$ Torr to produce an aluminum layer having a thickness of about 150 nm.

The photovoltaic cell was subsequently encapsulated using glass capsules with a silicon seal. Once encapsulated, the photovoltaic cell was annealed on a hot plate at about 80° C. for about 40 minutes. Dried nitrogen was blown over the photovoltaic cell opposite the heating plate to maintain the side at room temperature.

Figure 6:
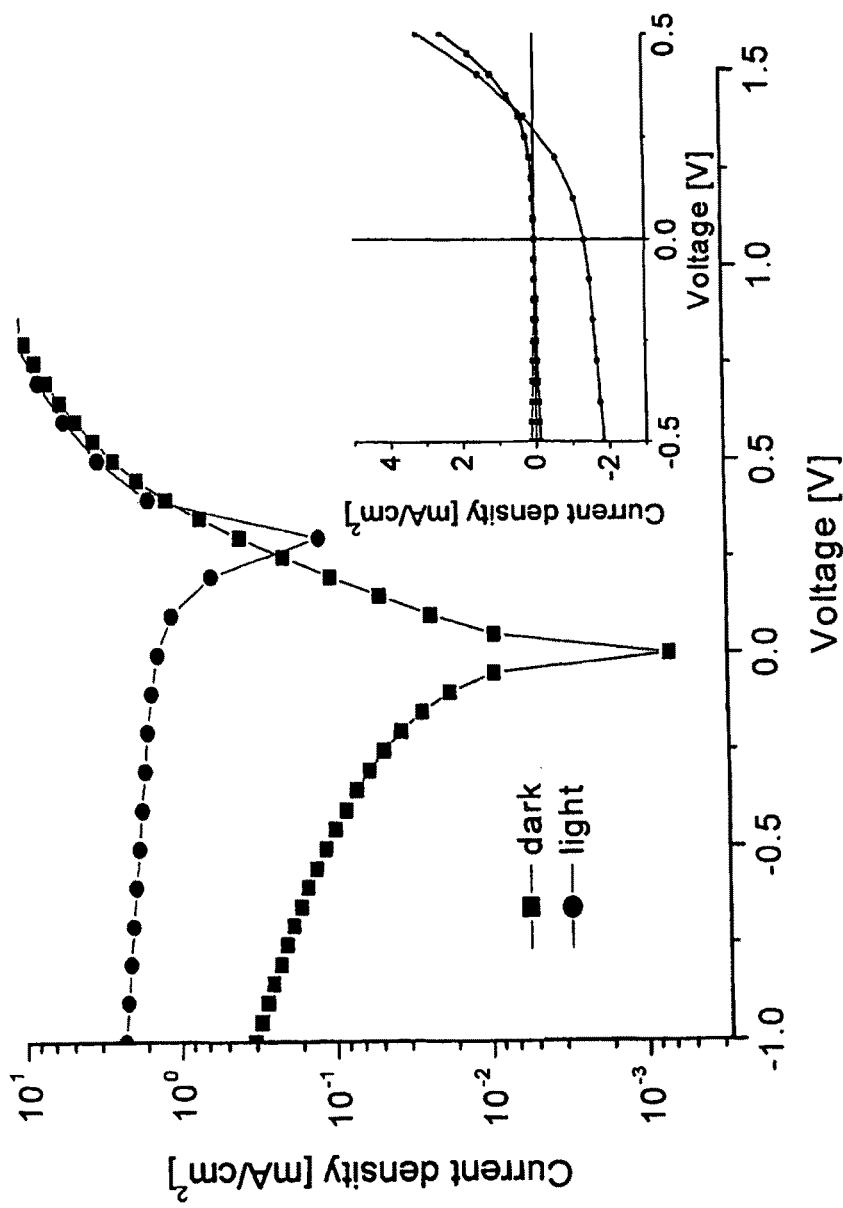
FIG. 6 illustrates a current-voltage plot of a photovoltaic device having a photosensitive layer comprising two composite organic layers according to one embodiment of the present invention.
Figure 7:
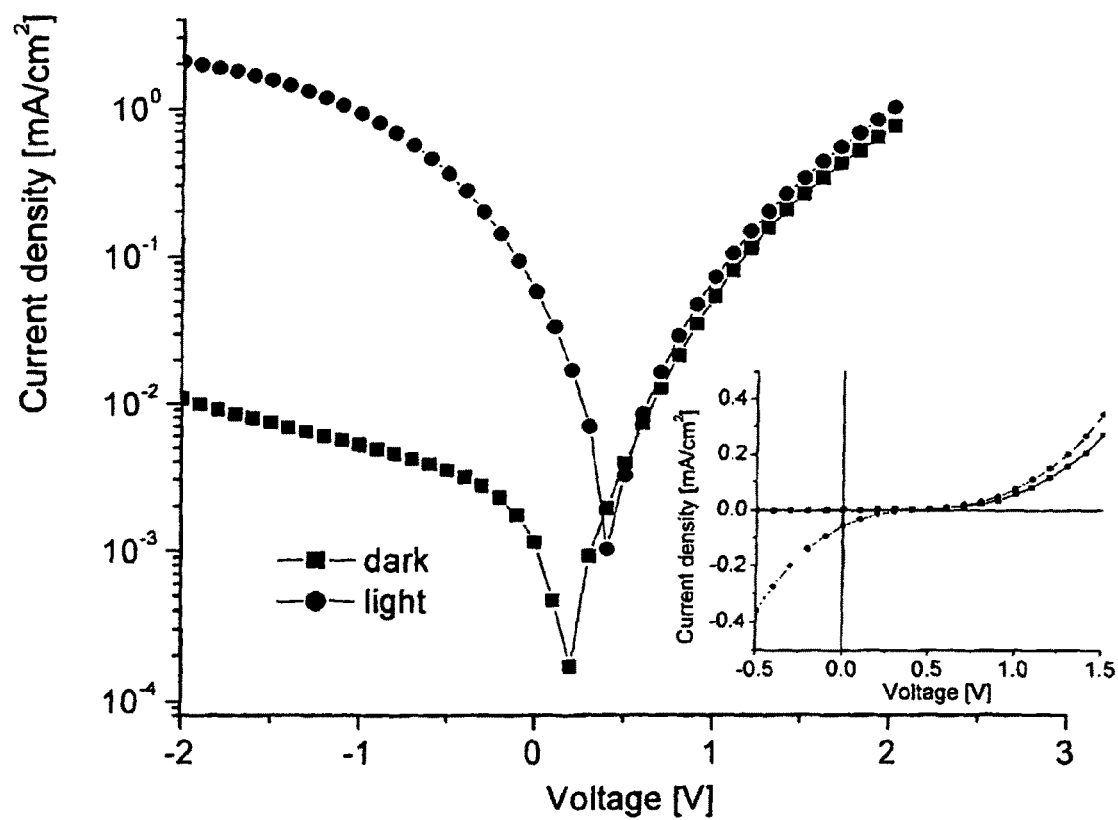
FIG. 7 illustrates a current-voltage plot of a photovoltaic device having a photosensitive layer comprising a single composite organic layer.

After fabrication, the photovoltaic cell was tested to determine performance characteristics in terms of current density and circuit voltage. FIG. 6 illustrates current-voltage (I-V) plots of the photovoltaic cell having a photosensitive layer comprising two composite organic layers. Moreover, FIG. 7 illustrates I-V plots for a comparative photovoltaic cell having a photosensitive layer comprising a single composite organic layer. The comparative photovoltaic cell was fabricated in a manner similar to that of the photovoltaic cell of the present example, the difference being that an aluminum cathode was applied after fabricating a single organic composite layer. I-V plots of the photovoltaic cells were measured using a Keithley 236 Source Measure Unit. The solar simulator used was an AM1.5G from Oriel. The illumination intensity was 80 mW cm$^{-2}$.

As demonstrated in FIGS. 6 and 7, the photovoltaic cell of the present invention comprising two composite organic layers demonstrated increased $I_{sc}$ and $V_{oc}$ in comparison with the photovoltaic cell having a single composite organic layer.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A method of producing a photovoltaic cell comprising:
providing a radiation transmissive first electrode;
providing a photosensitive composite organic layer;
disposing the photosensitive composite organic layer in electrical communication with the first electrode; and
disposing a second electrode in electrical communication with the photosensitive composite organic layer, wherein providing the photosensitive composite organic layer comprises providing a mixture comprising a polymeric phase, a nanoparticle phase, a first solvent solubilizing the nanoparticle phase and a second solvent solubilizing the polymeric phase and precipitating at least one exaggerated nanocrystalline grain in the polymeric phase, the exaggerated nanocrystalline grain comprising a plurality of nanoparticles of the nanoparticle phase, wherein the first solvent and the second solvent are at least partially immiscible.

2. The method of claim 1, wherein the nanoparticles of the nanoparticle phase comprise carbon nanoparticles.

3. The method of claim 2, wherein the carbon nanoparticles comprise single-walled carbon nanotubes, multi-walled carbon nanotubes, cut carbon nanotubes, fullerenes, doped carbon nanotubes or combinations thereof.

4. The method of claim 3, wherein the doped carbon nanotubes comprise boron doped carbon nanotubes, nitrogen doped carbon nanotubes or combinations thereof.

5. The method of claim 3, wherein fullerenes comprise fullerene conjugates.

6. The method of claim 5, wherein the fullerene conjugates comprise 1-(3-methoxycarbonyl)propyl-1-phenyl-(6,6)$C_{61}$ (PCBM), higher order fullerenes or endometallofullerenes.

7. The method of claim 1, wherein the polymeric phase comprises a conjugated polymer.

8. The method of claim 7, wherein the conjugated polymer comprises poly(3-hexylthiophene), poly(octylthiophene), polythiophene or combinations thereof.

9. The method of claim 1, wherein the polymeric phase comprises a semiconducting polymer.

10. The method of claim 9, wherein the semiconducting polymer comprises phenylene vinlylenes, polyfluorenes, polyfluorene derivatives, naphthalenes, naphthalene derivatives, poly(2-vinylpyridine), poly(N-vinlycarbazole), polypyrrole or polyaniline or combinations thereof.

11. The method of claim 1, wherein the radiation transmissive first electrode comprises a conducting oxide.

12. The method of claim 1 further comprising disposing a boosting layer between the photosensitive composite organic layer and the first electrode or the second electrode.

13. The method of claim 12, wherein the boosting layer comprises pyroelectric materials, piezoelectric materials or electret materials or combinations thereof.

14. The method of claim 13, wherein the boosting layer comprises polyvinyl fluoride, polyvinylidine fluoride or combinations thereof.

15. The method of claim 13, wherein the boosting layer comprises benzocyclobutene, perfluorocyclobutene or combinations thereof.

16. The method of claim 12, wherein the boosting layer further comprises nanoparticles dispersed in the pyroelectric materials, piezoelectric materials or electret materials.

17. The method of claim 16, wherein the boosting layer comprises carbon nanotubes dispersed in polyvinyl fluoride or polyvinlylidene fluoride or combinations thereof.

18. The method of claim 17, wherein the nanoparticles comprise single-walled carbon nanotubes, multi-walled carbon nanotubes, cut carbon nanotubes, fullerenes, doped carbon nanotubes or combinations thereof.

19. The method of claim 12, wherein the boosting layer has a thickness ranging from about 0.5 nm to about 50 nm.

20. The method of claim 12, wherein the boosting layer has a thickness ranging from about 10 nm to about 20 nm.

21. The method of claim 1, wherein the at least one exaggerated nanocrystalline grain is formed through the combination of the at least partially immiscible first and second solvents.

* * * * *